United States Patent
Mueller et al.

(10) Patent No.: US 8,389,331 B2
(45) Date of Patent: Mar. 5, 2013

(54) APPARATUS FOR RESTRICTING MOISTURE INGRESS

(75) Inventors: Tyler Mueller, Phoenix, AZ (US); Geoffrey Batchelder, Chandler, AZ (US); Ralph B. Danzl, Tempe, AZ (US); Paul F. Gerrish, Phoenix, AZ (US); Anna J. Malin, Mesa, AZ (US); Trevor D. Marrott, Mesa, AZ (US); Michael F. Mattes, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 13/593,549

(22) Filed: Aug. 24, 2012

(65) Prior Publication Data

US 2012/0311855 A1    Dec. 13, 2012

Related U.S. Application Data

(60) Continuation of application No. 13/302,725, filed on Nov. 22, 2011, now Pat. No. 8,263,436, which is a division of application No. 12/569,504, filed on Sep. 29, 2009, now Pat. No. 8,072,056.

(60) Provisional application No. 61/185,881, filed on Jun. 10, 2009, provisional application No. 61/229,867, filed on Jul. 30, 2009, provisional application No. 61/229,869, filed on Jul. 30, 2009, provisional application No. 61/235,745, filed on Aug. 21, 2009.

(51) Int. Cl.
*H01L 21/00* (2006.01)
(52) U.S. Cl. .......... 438/109; 438/121; 438/115
(58) Field of Classification Search .......... None
See application file for complete search history.

(56) References Cited

U.S. PATENT DOCUMENTS

| | | |
|---|---|---|
| 3,388,301 A | 6/1968 | James |
| 3,943,557 A | 3/1976 | Frazee et al. |
| 4,224,565 A | 9/1980 | Sosniak et al. |
| 4,285,002 A | 8/1981 | Campbell |
| 4,530,029 A | 7/1985 | Beristain |
| 4,684,884 A | 8/1987 | Soderlund |
| 4,701,826 A | 10/1987 | Mikkor |
| 4,773,972 A | 9/1988 | Mikkor |
| 4,775,831 A | 10/1988 | Annamalai |
| 4,868,712 A | 9/1989 | Woodman |
| 4,870,224 A | 9/1989 | Smith et al. |
| 5,059,899 A | 10/1991 | Farnworth et al. |
| 5,315,486 A | 5/1994 | Fillion et al. |
| 5,381,039 A | 1/1995 | Morrison |
| 5,381,804 A | 1/1995 | Shambroom |
| 5,572,065 A | 11/1996 | Burns |
| 5,592,391 A | 1/1997 | Muyshondt et al. |
| 5,606,264 A | 2/1997 | Licari et al. |
| 5,682,065 A | 10/1997 | Farnworth et al. |

(Continued)

FOREIGN PATENT DOCUMENTS

| | | |
|---|---|---|
| EP | 0 232 935 | 8/1987 |
| EP | 1 128 174 A2 | 8/2001 |

(Continued)

OTHER PUBLICATIONS

U.S. Appl. No. 61/406,961, filed Oct. 26, 2010, O'Brien.

(Continued)

*Primary Examiner* — David E Graybill
(74) *Attorney, Agent, or Firm* — Evans M. Mburu; Stephen W. Bauer

(57) ABSTRACT

Apparatus and methods to protect circuitry from moisture ingress, e.g., using a metallic structure as part of a moisture ingress barrier.

20 Claims, 10 Drawing Sheets

U.S. PATENT DOCUMENTS

| | | | |
|---|---|---|---|
| 5,837,562 A | 11/1998 | Cho | |
| 5,938,956 A | 8/1999 | Hembree et al. | |
| 5,955,789 A | 9/1999 | Vendramin | |
| 6,022,787 A | 2/2000 | Ma | |
| 6,032,064 A | 2/2000 | Devlin et al. | |
| 6,074,891 A | 6/2000 | Staller | |
| 6,144,866 A | 11/2000 | Miesel et al. | |
| 6,145,384 A | 11/2000 | Ikeda et al. | |
| 6,171,252 B1 | 1/2001 | Roberts | |
| 6,221,024 B1 | 4/2001 | Miesel | |
| 6,278,379 B1 | 8/2001 | Allen et al. | |
| 6,287,256 B1 | 9/2001 | Park et al. | |
| 6,297,072 B1 | 10/2001 | Tilmans et al. | |
| 6,297,551 B1 | 10/2001 | Dudderar et al. | |
| 6,298,255 B1 | 10/2001 | Cordero et al. | |
| 6,303,977 B1 | 10/2001 | Schroen et al. | |
| 6,323,550 B1 | 11/2001 | Martin et al. | |
| 6,335,669 B1 | 1/2002 | Miyazaki et al. | |
| 6,343,019 B1 | 1/2002 | Jiang et al. | |
| 6,394,953 B1 | 5/2002 | Devlin et al. | |
| 6,477,901 B1 | 11/2002 | Tadigadapa | |
| 6,486,534 B1 | 11/2002 | Sridharan et al. | |
| 6,500,694 B1 | 12/2002 | Enquist | |
| 6,514,798 B2 | 2/2003 | Farnworth | |
| 6,515,870 B1 | 2/2003 | Skinner et al. | |
| 6,516,808 B2 | 2/2003 | Schulman | |
| 6,555,025 B1 | 4/2003 | Krupetsky | |
| 6,555,856 B1 | 4/2003 | Staller | |
| 6,563,133 B1 | 5/2003 | Tong | |
| 6,566,596 B1 | 5/2003 | Askew | |
| 6,566,736 B1 | 5/2003 | Ogawa et al. | |
| 6,638,784 B2 | 10/2003 | Bartlett et al. | |
| 6,696,369 B2 | 2/2004 | Fraser et al. | |
| 6,718,206 B2 | 4/2004 | Casavant | |
| 6,762,072 B2 | 7/2004 | Lutz | |
| 6,774,327 B1 | 8/2004 | Wong | |
| 6,821,342 B2 | 11/2004 | Mattes et al. | |
| 6,822,326 B2 | 11/2004 | Enquist et al. | |
| 6,855,115 B2 | 2/2005 | Fonseca et al. | |
| 6,867,073 B1 | 3/2005 | Enquist | |
| 6,874,367 B2 | 4/2005 | Jakobsen et al. | |
| 6,902,987 B1 | 6/2005 | Tong et al. | |
| 6,903,918 B1 | 6/2005 | Brennan | |
| 6,962,835 B2 | 11/2005 | Tong et al. | |
| 6,968,743 B2 | 11/2005 | Rich et al. | |
| 6,986,965 B2 | 1/2006 | Jenson et al. | |
| 7,041,178 B2 | 5/2006 | Tong et al. | |
| 7,096,580 B2 | 8/2006 | Gonzalez et al. | |
| 7,109,092 B2 | 9/2006 | Tong | |
| 7,126,212 B2 | 10/2006 | Enquist et al. | |
| 7,147,604 B1 | 12/2006 | Allen et al. | |
| 7,150,195 B2 | 12/2006 | Jacobsen et al. | |
| 7,162,926 B1 | 1/2007 | Guziak et al. | |
| 7,205,181 B1 | 4/2007 | MacIntyre | |
| 7,233,048 B2 | 6/2007 | Rybnicek | |
| 7,238,999 B2 | 7/2007 | LaFond et al. | |
| 7,247,517 B2 | 7/2007 | Rumer et al. | |
| 7,305,889 B2 | 12/2007 | Fortin et al. | |
| 7,318,264 B2 | 1/2008 | Schugt | |
| 7,396,698 B2 | 7/2008 | Horning et al. | |
| 7,403,818 B2 | 7/2008 | Kramer et al. | |
| 7,462,552 B2 | 12/2008 | Tong et al. | |
| 7,485,968 B2 | 2/2009 | Enquist et al. | |
| 7,495,462 B2 | 2/2009 | Hua et al. | |
| 7,540,188 B2 | 6/2009 | Wiese et al. | |
| 7,553,582 B2 | 6/2009 | Bates | |
| 7,563,692 B2 | 7/2009 | Fortin et al. | |
| 7,622,324 B2 | 11/2009 | Enquist et al. | |
| 7,647,836 B2 | 1/2010 | O'Brien et al. | |
| 7,748,277 B2 | 7/2010 | O'Brien et al. | |
| 7,759,774 B2 | 7/2010 | Fraser et al. | |
| 7,781,250 B2 | 8/2010 | Wang et al. | |
| 7,829,363 B2 | 11/2010 | You | |
| 7,886,608 B2 | 2/2011 | Mothilal et al. | |
| 7,902,851 B2 | 3/2011 | Fenner et al. | |
| 8,072,056 B2 * | 12/2011 | Mueller et al. | 257/686 |
| 8,263,436 B2 * | 9/2012 | Mueller et al. | 438/109 |
| 2001/0033024 A1 | 10/2001 | Fraser et al. | |
| 2002/0115920 A1 | 8/2002 | Rich et al. | |
| 2004/0012083 A1 | 1/2004 | Farrell | |
| 2004/0079277 A1 | 4/2004 | Mattes et al. | |
| 2004/0082145 A1 | 4/2004 | Reichenbach | |
| 2004/0186396 A1 | 9/2004 | Roy et al. | |
| 2004/0222478 A1 | 11/2004 | Zhang et al. | |
| 2005/0009246 A1 | 1/2005 | Enquist et al. | |
| 2005/0065565 A1 | 3/2005 | Kramer et al. | |
| 2005/0151151 A1 | 7/2005 | Hawtof | |
| 2005/0284815 A1 | 12/2005 | Sparks | |
| 2006/0033204 A1 | 2/2006 | Fraser et al. | |
| 2006/0110854 A1 | 5/2006 | Horning et al. | |
| 2006/0264004 A1 | 11/2006 | Tong et al. | |
| 2006/0267167 A1 | 11/2006 | McCain | |
| 2006/0273430 A1 | 12/2006 | Hua et al. | |
| 2007/0037379 A1 | 2/2007 | Enquist et al. | |
| 2007/0107524 A1 | 5/2007 | O'Brien | |
| 2007/0158769 A1 | 7/2007 | You | |
| 2007/0179545 A1 | 8/2007 | Warkentin et al. | |
| 2007/0199385 A1 | 8/2007 | O'Brien et al. | |
| 2007/0251338 A1 | 11/2007 | Wiese et al. | |
| 2007/0261497 A1 | 11/2007 | O'Brien et al. | |
| 2007/0269921 A1 | 11/2007 | You | |
| 2008/0027332 A1 | 1/2008 | Bradley | |
| 2008/0102096 A1 | 5/2008 | Molin | |
| 2008/0312726 A1 | 12/2008 | Frank et al. | |
| 2009/0057868 A1 | 3/2009 | Wang et al. | |
| 2009/0270707 A1 | 10/2009 | Alfoqaha et al. | |
| 2009/0308169 A1 | 12/2009 | Mothilal et al. | |
| 2010/0262208 A1 | 10/2010 | Parker | |
| 2010/0263794 A1 | 10/2010 | George | |
| 2010/0304151 A1 | 12/2010 | Tuennermann | |
| 2010/0314149 A1 | 12/2010 | Gerrish et al. | |
| 2010/0314726 A1 | 12/2010 | Mueller et al. | |
| 2010/0314733 A1 * | 12/2010 | Mueller et al. | 257/684 |
| 2010/0315110 A1 | 12/2010 | Fenner et al. | |
| 2010/0324614 A1 | 12/2010 | Mueller et al. | |
| 2012/0064670 A1 * | 3/2012 | Mueller et al. | 438/115 |
| 2012/0100318 A1 | 4/2012 | Danzl et al. | |
| 2012/0161305 A1 | 6/2012 | Ruben et al. | |
| 2012/0197155 A1 | 8/2012 | Mattes et al. | |
| 2012/0311855 A1 * | 12/2012 | Mueller et al. | 29/825 |

FOREIGN PATENT DOCUMENTS

| | | |
|---|---|---|
| EP | 1 864 784 | 12/2007 |
| WO | WO 2008/044349 | 4/2008 |

OTHER PUBLICATIONS

Lau, "MEMS Structures for Stress Measurements for Thin Films Deposited Using CVD," Master of Science Thesis, Massachusetts Institute of Technology, Feb. 2001, 79 pgs.

Lea et al., "DRIE from MEMS to wafer-level packaging," *Solid State Technology*, Dec. 2007; 50(12), 8 pgs. Retrieved online on Oct. 11, 2010. Available online at <url:http://www.electroiq.com/ElectroIQ/en-us/index/display/Semiconductor_Article_Tools_Template.articles.solid-state-technology.volume-50.issue-12.features.mems.drie-from-mems-to-wafer-level-packaging.html>.

Osterberg et al., "M-TEST: A Test Chip for MEMS Using Electrostatically Actuated Test Structures," *Journal of Microelectromechanical Systems*, Jun. 1997; 6(2): 107-118.

Pham et al., "High-aspect-ratio bulk micromachined vias contacts," ProcSAFE & Prorisc 2004, Veldhoven, NL, Nov. 25-26, 2004, pp. 742-746.

Potkay, "Long Term, Implantable Blood Pressure Monitoring Systems," *Biomed Microdevices*, 2008; 10:379-392. Published online Dec. 20, 2007.

EnerChip™, CBC012, Rechargeable Solid State Energy Storage: 12 μAh, 3.8V, Cymbet Corporation, DS-72-02 Rev. A, 2009-2010 Cymbet™ Corporation (5 pp.).

Gillner et al., "Laser Bonding of Micro Optical Components," Proceedings of SPIE, vol. 4941, pp. 112-120, Oct. 30, 2003.

Park, "Characterization of Transmission Laser Bonding (TLB) Technique for Microsystem Packaging," Arizona State University, May 2006 (135 pgs.).

Sari et al., "Applications of Laser Transmission Processes for the Joining of Plastics, Silicon and Glass Micro Parts," Microsyst Technol. (2008) 14:1879-1886, published online Jul. 18, 2008.

Theppakuttai et al., "Localized Laser Transmission Bonding for Microsystem Fabrication and Packaging," Journal of Manufacturing Processes, vol. 6, No. 1, 2004 (8 pgs.).

Thinergy, The Leading Thin Power Solution, 2010 Infinite Power Solutions, Inc. (2 pp.) accesslined online Oct. 14, 2010 at http://www.infinitepowersolutions.com/product/thinergy.

Wiemer et al., "Developments Trends in the Field of Wafer Bonding Technologies," 214th ESC Meeting, Abstract #2229, Oct. 12-Oct. 17, 2008, Honolulu, HI (1 pg.).

Wild et al., "Locally Selective Bonding of Silicon with Glass with Laser," Sensors and Actuators A: Physical, vol. 93, Issue 1, Aug. 25, 2001, p. 63-69.

Witte et al., "Laser Joining of Glass with Silicon," Proceedings of SPIE, vol. 4637, Jan. 21, 2002, pp. 487-495.

Oberg et al., Machinery's Handbook, $25^{th}$ edition, Industrial Press, New York, NY, 1996; title page, copyright page and p. 267. 2 pages total.

\* cited by examiner

APPARATUS FOR RESTRICTING MOISTURE INGRESS

CROSS-REFERENCE TO RELATED APPLICATIONS

This application is a continuation application of U.S. application Ser. No. 13/302,725 filed on Nov. 22, 2011 now U.S. Pat. No. 8,263,436, which is a divisional application of U.S. application Ser. No. 12/569,504 filed on Sep. 29, 2009 now U.S. Pat. No. 8,072,056, which claims the benefit of U.S. Provisional Application Ser. No. 61/185,881 filed 10 Jun. 2009, entitled "FARADAY CAGE FOR CIRCUITRY USING SUBSTRATES," U.S. Provisional Application Ser. No. 61/229,867 filed 30 Jul. 2009, entitled "APPARATUS FOR RESTRICTING MOISTURE INGRESS," U.S. Provisional Application Ser. No. 61/229,869 filed 30 Jul. 2009, entitled "HERMETICITY TESTING," and U.S. Provisional Application Ser. No. 61/235,745 filed 21 Aug. 2009, entitled "HERMETICALLY-SEALED ELECTRICAL CIRCUIT APPARATUS," all of which are incorporated herein by reference in their respective entireties.

BACKGROUND

The disclosure herein relates generally to apparatus for protecting circuitry from moisture ingress, and further to fabrication methods for constructing such apparatus.

Electrical circuits (e.g., integrated circuits) include many types of active and passive devices (e.g., transistors, capacitors, resistors, etc.) that may be subject to damage from moisture (e.g., corrosion and functional changes to the system). For example, moisture may affect the operation and performance of circuitry, such as sensitive circuits used in implantable medical devices (e.g., sensor circuitry, pacing circuitry, timing circuitry, etc.). One way to mitigate such moisture issues is to protect such circuits using a moisture barrier.

Various attempts have previously been made to seal the interior of semiconductor device dies from moisture ingress. The bottom substrate in many semiconductor devices (e.g., silicon) effectively blocks moisture from entering the interior of the die from the bottom, but materials commonly employed in fabricating further layers above the substrate may provide a path for moisture to enter from the top and/or sides of the die after separation. For example, certain commonly employed insulator materials such as silicon oxide (SiO) may be penetrated by moisture. Accordingly, lateral or side seal structures have been provided between the die edges and the active region. Such side seal structures, e.g., may be formed in one or more layers in the processed semiconductor device using vertically oriented contacts (e.g., such as tungsten) and metal die seal structures.

For example, an upper seal layer is described in U.S. Pat. No. 6,566,736 entitled "DIE SEAL FOR SEMICONDUCTOR DEVICE MOISTURE PROTECTION," issued on May 20, 2003, which allegedly provides a vertical moisture seal.

SUMMARY

The disclosure herein relates generally to apparatus for protecting circuitry from moisture ingress, and methods for providing such apparatus. For example, as described in one or more embodiments herein, semiconductor substrates and semiconductor fabrication techniques may be used to provide a moisture ingress barrier and a hermetic interface to protect circuit devices (e.g., a die that includes circuitry).

One exemplary apparatus disclosed herein includes an electrical circuit apparatus including a moisture ingress barrier. The apparatus includes a first portion and a second portion. The first portion includes at least one side surface, a substantially planar connection surface, a substrate (e.g., a semiconductor substrate) provided from a wafer, and one or more layers formed on the substrate terminating at the connection surface. At least a portion of the at least one side surface is defined by the one or more layers. Further, the one or more layers include at least one circuit device (e.g., including electrical circuitry, forming a part of an implantable medical device, etc.) and a metallic structure laterally surrounding the at least one circuit device and forming at least part of the moisture ingress barrier. A perimeter region is defined between the at least one circuit device and the at least one side surface and the metallic structure extends from the substrate to the connection surface and is located within the perimeter region. The second portion includes at least one side surface, a substantially planar connection surface and a substrate (e.g., a semiconductor substrate) provided from a wafer. At least a portion of the at least one surface is defined by the substrate. The connection surface of the first portion is bonded to the connection surface of the second portion to form a hermetic interface proximate the metallic structure of the first portion and the hermetic interface forms at least a part of the moisture ingress barrier (e.g., the metallic structure of the first portion may be metallically bonded to a metallic region of the second portion to form at least part of the hermetic interface, a region of the first portion adjacent the metallic structure may be covalently bonded to a region of the second portion to form at least part of the hermetic interface, etc.).

Another exemplary apparatus disclosed herein includes an electrical circuit apparatus including a moisture ingress barrier. The apparatus includes a first portion and a second portion. The first portion includes at least one side surface, a substantially planar connection surface, a substrate (e.g., a semiconductor substrate) provided from a wafer, and one or more layers formed on the substrate terminating at the connection surface. At least a portion of the at least one side surface is formed by the one or more layers. Further, the one or more layers include at least one circuit device (e.g., including electrical circuitry, forming a part of an implantable medical device, etc.) and a metallic structure laterally surrounding the at least one circuit device and forming at least part of the moisture ingress barrier. A perimeter region is defined between the at least one circuit device and the at least one side surface and the metallic structure extends from the substrate to the connection surface and is located within the perimeter region. The second portion includes at least one side surface, a substantially planar connection surface, a substrate (e.g., a semiconductor substrate) provided from a wafer, and one or more layers formed on the substrate terminating at the connection surface. At least a portion of the at least one side surface is defined by the one or more layers. Further, the one or more layers include at least one circuit device (e.g., including electrical circuitry, forming a part of an implantable medical device, etc.) and a metallic structure laterally surrounding the at least one circuit device and forming at least part of the moisture ingress barrier. A perimeter region is defined between the at least one circuit device and the at least one side surface and the metallic structure extends from the substrate to the connection surface and is located within the perimeter region. The connection surface of the first portion is bonded to the connection surface of the second portion to form a hermetic interface proximate the metallic structures of the first and the second portions and the hermetic interface forms at least part of the moisture ingress barrier (e.g., the metallic structure of the first portion may be metallically bonded to a metallic region of the second portion to form at least part of the hermetic interface, a region of the first portion adjacent the metallic structure may be covalently bonded to a region of the second portion to form at least part of the hermetic interface, etc.).

One exemplary method disclosed herein includes providing at least one electrical circuit apparatus including a moisture ingress barrier. The method includes providing a first portion and providing a second portion. The first portion and the second portion each include a substantially planar connection surface. Providing the first portion includes providing a wafer substrate (e.g., a semiconductor substrate) and providing one or more layers formed on the substrate terminating at the connection surface. The one or more layers include at least one circuit device (e.g., including electrical circuitry, forming a part of an implantable medical device, etc.) and at least one metallic structure laterally surrounding the at least one circuit device and forming at least part of the moisture ingress barrier of the at least one electrical circuit apparatus. A perimeter region is defined laterally surrounding the at least one circuit device and the at least one metallic structure extends from the substrate to the connection surface and is located within the perimeter region. Providing the second portion includes providing a wafer substrate. The method further includes coupling the connection surface of the first portion to the connection surface of the second portion to form at least one hermetic interface proximate the at least one metallic structure of the first portion (e.g., covalently bonding at least one region of the first portion adjacent the at least one metallic structure to at least one region of the second portion to form the at least a part of the at least one hermetic interface, metallically bonding the at least one metallic structure of the first portion to at least one metallic region of the second portion to form at least a part of the at least one hermetic interface, etc.). The at least one hermetic interface forms at least part of the moisture ingress barrier of the at least one electrical circuit apparatus.

The above summary is not intended to describe each embodiment or every implementation of the present disclosure. A more complete understanding will become apparent and appreciated by referring to the following detailed description and claims taken in conjunction with the accompanying drawings.

DETAILED DESCRIPTION OF EXEMPLARY EMBODIMENTS

Figure 1A:
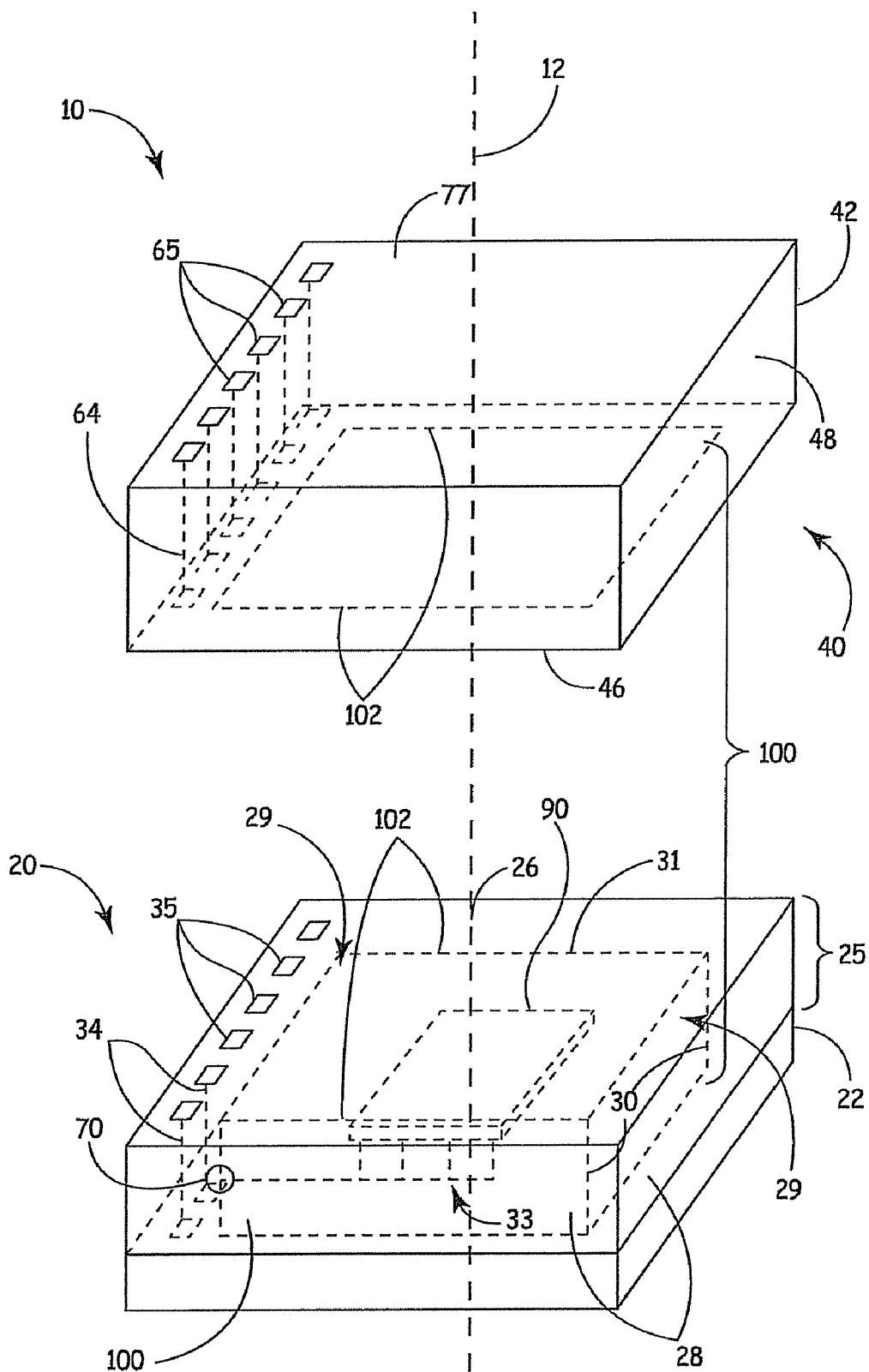
FIGS. 1A-1B are generalized illustrative exploded perspective and side views, respectively, of one exemplary embodiment of an apparatus including a moisture ingress barrier.

In the following detailed description of illustrative embodiments, reference is made to the accompanying figures of the drawing which form a part hereof, and in which are shown, by way of illustration, specific embodiments which may be practiced. It is to be understood that other embodiments may be utilized and structural changes may be made without departing from (e.g., still falling within) the scope of the disclosure presented hereby.

Exemplary apparatus, and methods of constructing such apparatus, shall be described with reference to FIGS. 1-6. It will be apparent to one skilled in the art that elements from one embodiment may be used in combination with elements of the other embodiments, and that the possible embodiments of such apparatus using combinations of features set forth herein is not limited to the specific embodiments shown in the Figures and/or described herein. Further, it will be recognized that the embodiments described herein may include many elements that are not necessarily shown to scale. Further, it will be recognized that the size and shape of various elements herein may be modified but still fall within the scope of the present disclosure, although one or more shapes and/or sizes, or types of elements, may be advantageous over others.

Figure 1B:
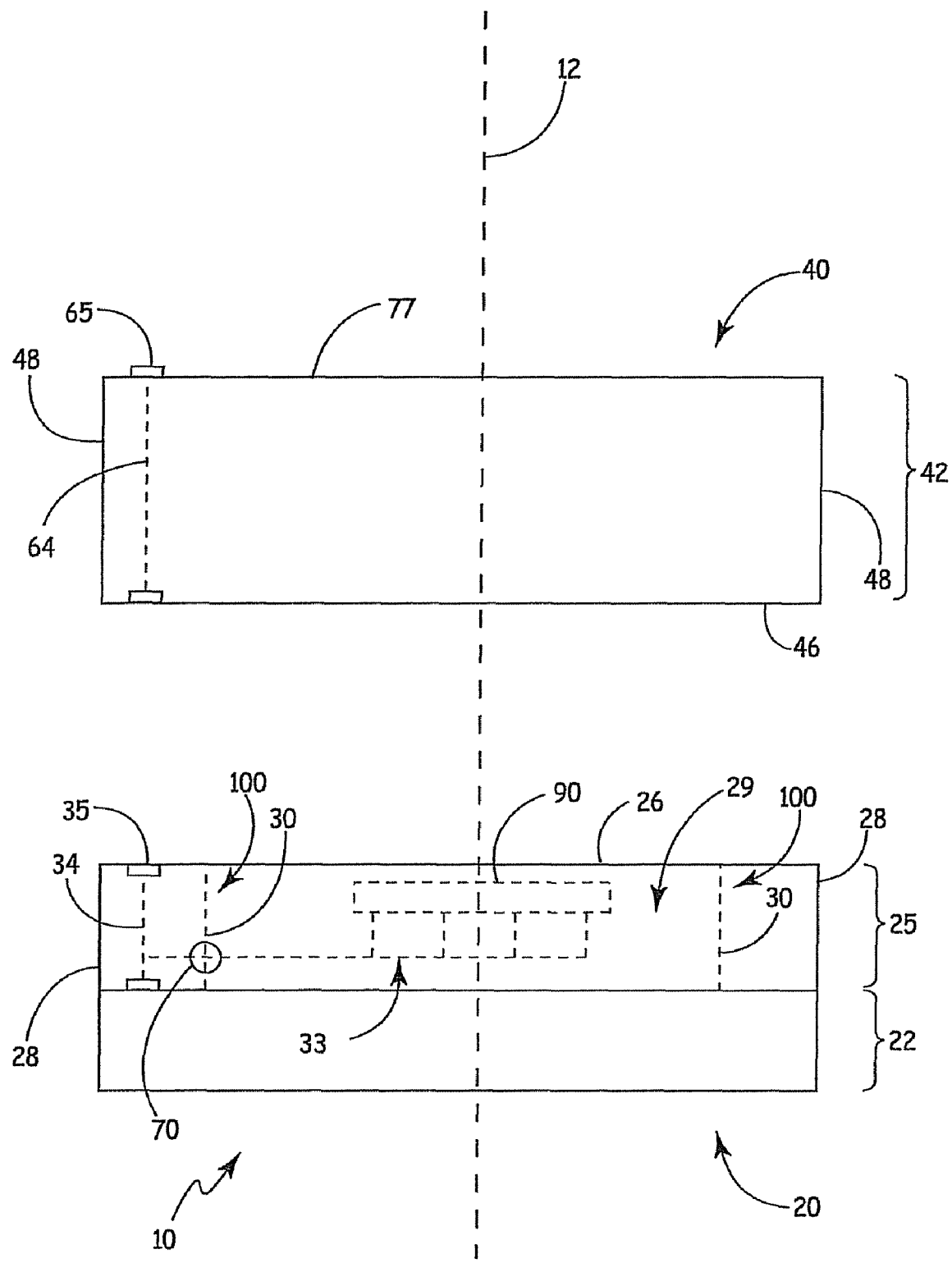

FIGS. 1A-1B show generalized exploded perspective and side views of components which may form a part of an exemplary apparatus 10 that when assembled includes a moisture ingress barrier 100 (schematically represented by the dashed line) at least partially laterally surrounding a circuit device 90 (or more than one circuit devices). As used herein, laterally surrounding the circuit device 90 is defined as being situated around the sides of the circuit device 90 (e.g., partially laterally surrounding the circuit device 90 refers to the moisture ingress barrier 100 being situated around some or all of the sides of the circuit device 90). Further, in one or more embodiments, the moisture ingress barrier 100 laterally surrounds the entire circuit device 90 (e.g., as shown in FIGS. 1A-1B).

The circuit device 90 may be any device that includes electrical circuitry that performs one or more functions (e.g., sensing, detecting, processing, etc.). The moisture ingress barrier 100 restricts moisture ingress (e.g., movement of moisture), e.g., to protect the circuit device 90 from moisture. As used herein, "moisture" may be defined as any material capable of ingressing into semiconductor devices. For example, moisture may include water, biological liquids, vapors, gases, etc. Further, the moisture ingress barrier 100 may take any shape or size suitable for its intended purpose. For example, the barrier may be rectangular in shape (e.g., with four side walls), cylindrical in shape (e.g., a circular side wall), etc. Further, for example, the shape of the barrier 100 may not be describable by a particular shape (e.g., in the case where, for example, the barrier is shaped to conform to a device that it is protecting and may be formed using stepped vias).

Although not limited thereto, in one or more embodiments, the apparatus 10 is beneficial for restricting moisture ingress into the circuitry of a package used in implantable medical devices. For example, the apparatus 10 including the circuit device 90 and the moisture barrier 100 may be a part of an implantable medical device. For example, the implantable medical device may be a device implantable in a body near a human heart. For example, the implanted medical device may be any implantable cardiac pacemaker, defibrillator, cardioverter-defibrillator, or pacemaker-cardioverter-defibrillator (PCD). Further, for example, the implantable medical device may be an implantable nerve stimulator or muscle stimulator, an implantable monitoring device (e.g., a hemodynamic monitoring device), a brain stimulator, a gastric stimulator, a drug pump, or any other implantable device that would benefit from moisture protection. Therefore, the apparatus 10 may find wide application in any form of implantable medical device. As such, any description herein making reference to any particular medical device is not to be taken as a limitation of the type of medical device which can benefit from and which can employ the moisture ingress protection as described herein.

Further, although moisture ingress protection may be beneficial for implantable medical devices, such protection is not limited to such applications. For example, such protection may be beneficial for many different types of circuitry (e.g., whether for medical use or not, whether for an implantable medical device or not). For example, one or more types of circuits that may benefit from such moisture ingress protection may include circuits such as sensor circuits, pacing circuits, timing circuits, telemetry circuits, etc.

The apparatus 10, as shown generally in the exploded views of FIGS. 1A-1B, includes a first portion 20 and a second portion 40. The first portion 20 includes at least one side surface 28 (e.g., one side surface, four side surfaces, etc.) and at least a substantially planar connection surface 26. Further, a perimeter region 29 may be defined between the circuit device 90 and the at least one side surface 28. The second portion 40 also includes at least one side surface 48 (e.g., one side surface, four side surfaces, etc.) and at least a substantially planar connection surface 46.

In one or more embodiments, the first portion 20 may include one or more layers 25 formed over the substrate 22 (e.g., directly on a semiconductor substrate) terminating at connection surface 26. The one or more layers 25 may provide at least one circuit device, e.g., circuit device 90 and the metallic structure 30, which forms at least part of the moisture ingress barrier 100. In one or more embodiments, the metallic structure 30 (e.g., stacked vias, metal vias stacked on metal, non-metal vias stacked on metal, etc.) extends from the substrate 22 to the connection surface 26 and is located within the perimeter region 29. Further, the one or more layers 25 may include metal portions used for connection between various via layers to from at least a portion of the metallic structure 39. Still further, the metallic structure 30 may laterally surround the circuit device 90. In other words, the circuit device 90 may be arranged along an axis 12 (orthogonal to the connection surface 26) and the metallic structure 30 may be located a distance away from the axis 12 that is less than the distance from the axis 12 to the at least one side wall 28. Further, the metallic structure 30 may be continuous, discontinuous, and/or patterned. Although not depicted in the figures, in at least one embodiment, the metallic structure 30 may be electrically biased to, e.g., curtail or prevent corrosion. Further (also, although not depicted), in at least one embodiment, the metallic structure 30 may be grounded.

Further, in one or more embodiments, the one or more layers 25 provide at least one electrical interconnect 33 extending from the circuit device 90 (or other circuit devices located therein) to a location outside of the metallic structure 30 (e.g., a location between the metallic structure 30 and the at last one side wall 28, a location within the perimeter region 29, or a location outside of the apparatus 10).

At least in one embodiment, connection surface 26 may be defined at least partially by the one or more layers 25 and may include oxide material (e.g., in surface regions apart from one or more conductive portions of the connection surface 26, such as interconnect conductive pads 35, etc.). For example, such oxide material may be oxide material formed, deposited or grown as part of one or more processing steps (e.g., oxides such as BPSG, silicon oxide, native oxide, etc.).

In one or more embodiments, metallic structure 30 is formed in the one or more layers 25 to provide at least a portion of the moisture ingress barrier 100 (e.g., to provide at least portions of one or more side walls of the moisture ingress barrier 100). The metallic structure 30 may extend from the substrate 22 to the connection surface 26 terminating in a contact 31. Further, in one or more embodiments, the metallic structure 30 may be a plurality of conductive vias.

When assembled and/or coupled together (e.g., the connection surface 26 of the first portion 20 coupled to the connection surface 46 of the second portion 40, or in other words, to, e.g., form a face-to-face bonded die), the first and second portions 20, 40 form a hermetic interface 102 (e.g., at, adjacent, and/or near the interface between the metallic structure 30 at the surface 26 of the first portion 20 and the surface 46 of the second portion 40, etc.). The hermetic interface 102 forms at least a part of the moisture ingress barrier 100. For example, such interfaces are also shown by interface 235 in FIGS. 2A-2B, interface 335 in FIGS. 3A-3B, and interface 435 in FIGS. 4A-4B. Further, the moisture ingress barrier 100 (e.g., including at least the hermetic interface 102 and the metallic structure 30) may operate as a boundary that restricts (e.g., prevents) the ingress of moisture (e.g., towards the circuit device 90). As used herein, a hermetic interface is defined as an interface that restricts (e.g., prevents) moisture from passing, diffusing, pervading, infiltrating, ingressing, and/or leaking through itself In one or more embodiments, the moisture ingress barrier 100 may only occupy a portion of the apparatus 10 to restrict (e.g., prevent) moisture ingress from, e.g., a specific direction, or may only laterally surround the area of the apparatus 10 containing moisture sensitive circuitry.

Wafer scale fabrication techniques may be used to form each of the first and second portions 20, 40. Generally, in one or more embodiments, each of the first portion 20 and the second portion 40 includes a substrate provided from or as a part of a wafer (e.g., a portion of any size and shape of substrate usable in wafer scale fabrication processes, such as a circular silicon wafer, a glass substrate, etc.). In other words, multiple portions may be fabricated on a wafer (e.g., the first portions on a first wafer and the second portions on a second wafer). As such, the fabrication of each of the portions may be initiated with use of a wafer substrate (e.g., a semiconductor, conductor, or insulator substrate wafer). In one or more embodiments, the wafer substrate is a doped semiconductor wafer substrate (e.g., doped to either a bulk n-type or p-type wafer), such as those used as the base substrate for microelectronic devices (e.g., substrates built in and over using one or more microfabrication process steps such as doping, ion implantation, etching, deposition of various materials, and photolithographic patterning processes). In one or more embodiments, the semiconductor wafer is a silicon wafer. However, other available types of semiconductor wafers may be used, such as, for example, a gallium arsenide wafer, a germanium wafer, a silicon on insulator (SOI) wafer, etc. Further, for example, in one or more embodiments, the substrate may be formed of one or more materials other than semiconductor material, such as a glass substrate, wherein the substrate includes a metal film. In other words, for example, the first portion 20 may include a substrate 22 provided from or as a part of a wafer and the second portion 40 may include a substrate 42 provided from or as a part of a wafer.

Further, in one or more embodiments, the first portion 20 includes one or more interconnect vias 34 outside of the moisture ingress barrier 100 (e.g., between the metallic structure 30 and the at least one side wall 28). The one or more interconnect vias 34, for example, terminate with one or more conductive pads 35 at the connection surface 26 (e.g., for use in providing accessible surface contacts, such as surface contacts 65 at a surface of at least one of the first and second portions 20, 40). The at least one electrical interconnect 33 extending from circuit device 90 to a location outside of the moisture ingress barrier 100 (e.g., the metallic structure 30) passes through one or more insulated locations 70 of the moisture ingress barrier 100 (e.g., the metallic structure 30) to connect to the one or more interconnect vias 34.

Still further, in one or more embodiments, the first and second portions 20, 40 may not include interconnects or vias connecting the circuit devices to contact pads on the outside of the apparatus 10. For example, in at least one embodiment, the apparatus 10 may include various apparatus and/or structures to wirelessly communicate to other devices/apparatus outside of apparatus 10.

The formation of the at least one interconnect 33, the metallic structure 30 of the moisture ingress barrier 100, the one or more interconnect vias 34, and one or more of the various conductive pads or contacts of the first portion 20 (as well as those of the second portion 40) may be formed using standard microelectronic fabrication processing techniques (e.g., such as etching of materials, deposition of materials, and photolithographic patterning process steps, etc.). Various portions of first and second portions 20, 40 may be formed during the same or different processing steps. For example, a portion of a stacked via that may be used to provide a portion of an interconnect via 34 may be formed with an interconnect layer used to provide a portion of the interconnect 33. Still further, for example, process steps to form the vias may be completely separate therefrom, such as in the formation of a through-silicon via after other layer processing is completed. The present disclosure is not limited to any particular processing, or timing or order, of such process steps. However, some types of processing and order thereof may be beneficial over other types.

The one or more vias described herein may be constructed in one or more suitable forms for providing the functionality thereof in accordance to the disclosure provided herein. For example, the interconnect vias 34 of the first portion 20 may be formed as stacked interconnect vias formed as the one or more layers 25 are constructed. Further, for example, other vias described herein may be formed as through-silicon vias. For example, as described further herein, in one or more embodiments, the interconnect vias 64 of the second portion 40 may be formed using through-silicon vias. Further, other types of vias, such as trench vias or the like, may be used.

As described herein, the metallic structure 30 of the moisture ingress barrier 100 may be formed of a plurality of vias (e.g., stacked vias). The plurality of vias may be provided in one or more configurations suitable for restricting (e.g., preventing) moisture ingress. For example, any configuration suitable for restricting (e.g., preventing) moisture ingress to the interior of the moisture ingress barrier 100 may be used (e.g., the vias of the metallic structure 30 of the moisture ingress barrier 100 are thick enough to restrict moisture ingress and any holes or gaps in the barrier 100 are small enough to restrict moisture ingress therethrough). One or more different via configurations are shown and described with reference to FIGS. 5A-5B. However, the present disclosure is not limited thereto as various configurations of vias may be used to provide the moisture ingress functionality.

Figure 5A:
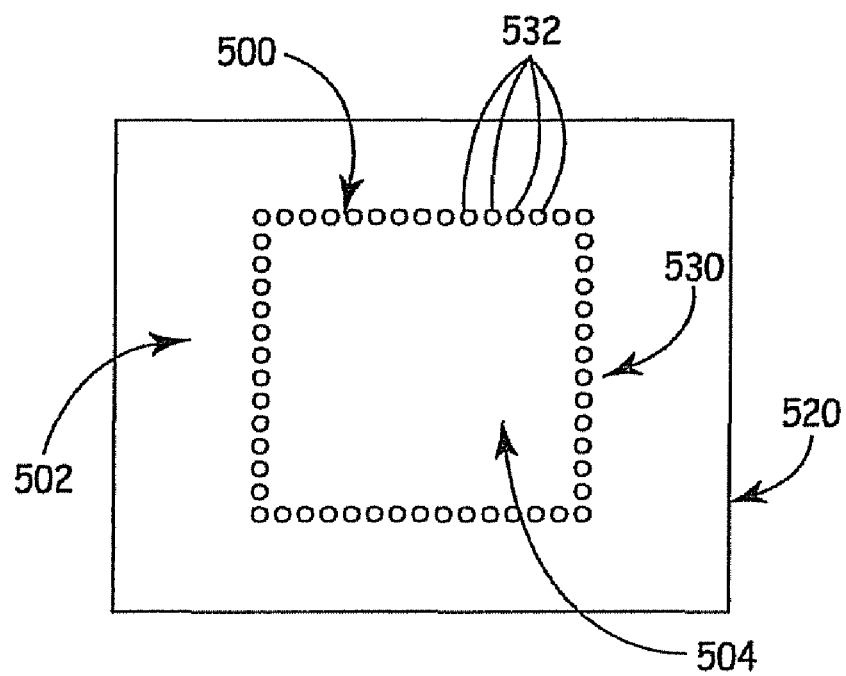
FIGS. 5A-5B illustrate various configurations that may be used to form the moisture ingress barrier shown generally in FIG. 1.
Figure 5B:
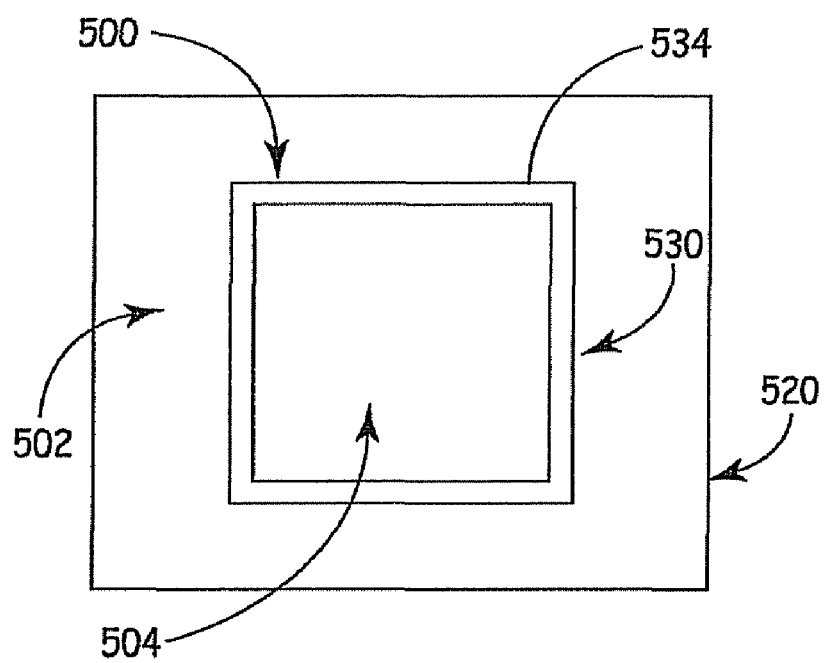

FIGS. 5A-5B depict top plan views of the first portion 520 of exemplary apparatus described herein (e.g., apparatus 10). In one or more embodiments, the metallic structure 530 of the moisture ingress barrier 500 may be formed of conductive vias 532 in a side by side configuration (e.g., one or more rows of vias) as shown in FIG. 5A. The spacing between such side by side vias 532 in the configuration shown in FIG. 5A would be small enough to restrict (e.g., prevent) fluid ingress from the outside 502 to the inside 504 of the moisture ingress barrier 500. Further, although not shown, the conductive vias 532 may be configured in rows (or any configuration) such that moisture has a longer path to reach a circuit device (e.g., from the outside 502 to the inside 504). Still further, for example, in one or more embodiments, the metallic structure 530 of the moisture ingress barrier 500 may be formed of one or more trenches 534 (e.g., trench vias) as shown in FIG. 5B. In other words, as used herein, a plurality of conductive vias refers to any type of via, including trenches formed to perform the same functionality. As described herein, the metallic structures may laterally surround the circuit devices, and as such, may also take any shape so as to surround such circuit devices, such as, e.g., circles, squares, rectangles, serpentines, etc.

In one or more embodiments, the materials used to form the moisture ingress barrier 100 may be any suitable material effective for use in restricting (e.g., preventing) the ingress of moisture therethrough. For example, in one or more embodiments, conductive materials such as one or more metals (e.g., aluminum, copper, tungsten, etc.) may be used for forming the moisture ingress barrier 100. Further, for example, in one or more embodiments, the conductive vias may be lined and/or filled with conductive materials including, for example, one or more metals (e.g., tungsten, titanium, copper, etc.). Further, in one or more embodiments, the materials used to form the moisture ingress barrier 100 may be polysilicon and/or any other semiconductor material.

In one or more embodiments, the second portion 40 includes the one or more interconnect vias 64 extending therein from connection surface 46 and terminating at one or more surface contacts 65 at surface 77 of the second portion 40. Such interconnect vias 64 may correspond to, and be alignable with, the interconnect vias 34 so as to provide electrical connection from the circuit device 90 to the surface contacts 65 at an outer portion of the apparatus 10. Surface contacts 65 may be located at any outer surface of the apparatus 10 with appropriate connection routing. However, some locations may be more beneficial than others. The surface contacts are configured for connection to one or more other conductive components, such as, without limitation, pads on a target board, lead conductors, etc.

In one or more embodiments where vias are formed in the substrate, such vias may be formed as through vias (e.g., such as through-silicon vias formed in a silicon substrate) extending through the substrate (and even one or more layers formed thereon). For example, the interconnect vias 64 may be constructed using through via techniques (e.g., through-silicon via techniques). For example, in one or more embodiments, without limitation, the vias may be formed by defining a hole (e.g., using a dry or wet etch) through a silicon substrate (e.g., may be etched through overlying layers of metal and dielectric formed thereon or therein using deep reactive ion etching process). Further, such holes may be formed by laser drilling or sand blasting. The hole may be lined with a dielectric (e.g., native oxide formation, the growing of oxide material (e.g., silicon oxide), or deposition of a dielectric material), and thereafter filled or lined with one or more conductive materials.

To form the apparatus 10, the first portion 20 and the second portion 40 are coupled together. For example, in one or more embodiments, the connection surfaces 26, 46 of first portion 20 and the second portion 40 may be coupled (e.g., bonded) together to assemble the apparatus 10. In such a manner, in one or more embodiments, the connection surface 26 of the first portion 20 is bonded (e.g., using wafer/die bonding techniques) to the connection surface 46 of the second portion 40 to form a hermetic interface 102 proximate the moisture ingress barrier 100 of the first portion 20. For example, a region of the first portion 20 adjacent the moisture ingress barrier 100 may be covalently bonded to a region of the second portion 40 (see, e.g., FIGS. 2A-2B) to form a hermetic interface (e.g., forming at least part of the moisture ingress barrier 100) or the metallic structure 30 of the moisture ingress barrier 100 may be metallically bonded to a metallic region or plurality of metallic regions located at the connection surface 46 of the second portion 40 (see, e.g., FIGS. 3A-4B) to form a hermetic interface (e.g., forming at least part of the moisture ingress barrier 100). Further, for example, in such a manner, in one or more embodiments, the plurality of interconnect vias 34 of the first portion 20 and the plurality of interconnect vias 64 of the second portion 40 are electrically connected when the connection surface 26 of the first portion 20 is bonded to the connection surface 46 of the second portion 40; thus, for example, forming a connection of the circuit device 90 to the surface contacts 65.

In one or more embodiments, bonding the first and second portions 20, 40 together to assemble the apparatus 10 may be implemented using any wafer or die bonding process (e.g., bonding a wafer including the first portions with a wafer including the second portions, which also refers to the bonding of an individual die to a full wafer and the bonding of an individual die to another individual die), such as chemical bonding processes (e.g., those using adhesion promoters, etc.), high temperature bonding processes (e.g., thermal fusion bonding, etc.), hydrogen bonding processes, anodic bonding processes, and oxide bonding processes (e.g., plasma enhanced bonding, etc.). For example, use of oxide bonding permits oxide surfaces (e.g., portions of the connection surfaces 26, 46 of the first and second portions 20, 40 including an oxide material, such as silicon oxide) to be bonded together. Further, for example, in one or more embodiments, the connection surfaces 26, 46 may be chemical mechanically polished or planarized to expose any conductive portions thereof (e.g., the via contacts 31 at connection surface 26, or conductive pads 35 at connection surface 26) to be exposed. For example, when the oxide portions and the conductive portions at the connection surface 26 (e.g., a planar surface) are aligned with the oxide portions and the conductive portions of the connection surface 46 (e.g., a planar surface), oxide bonding may be performed. For example, oxide bonding processes may form a bond between oxide portions of the connection surfaces 26, 46 of the first and second portions 20, 40 without the need for adhesives or other intermediate layers may be used.

Figure 2A:
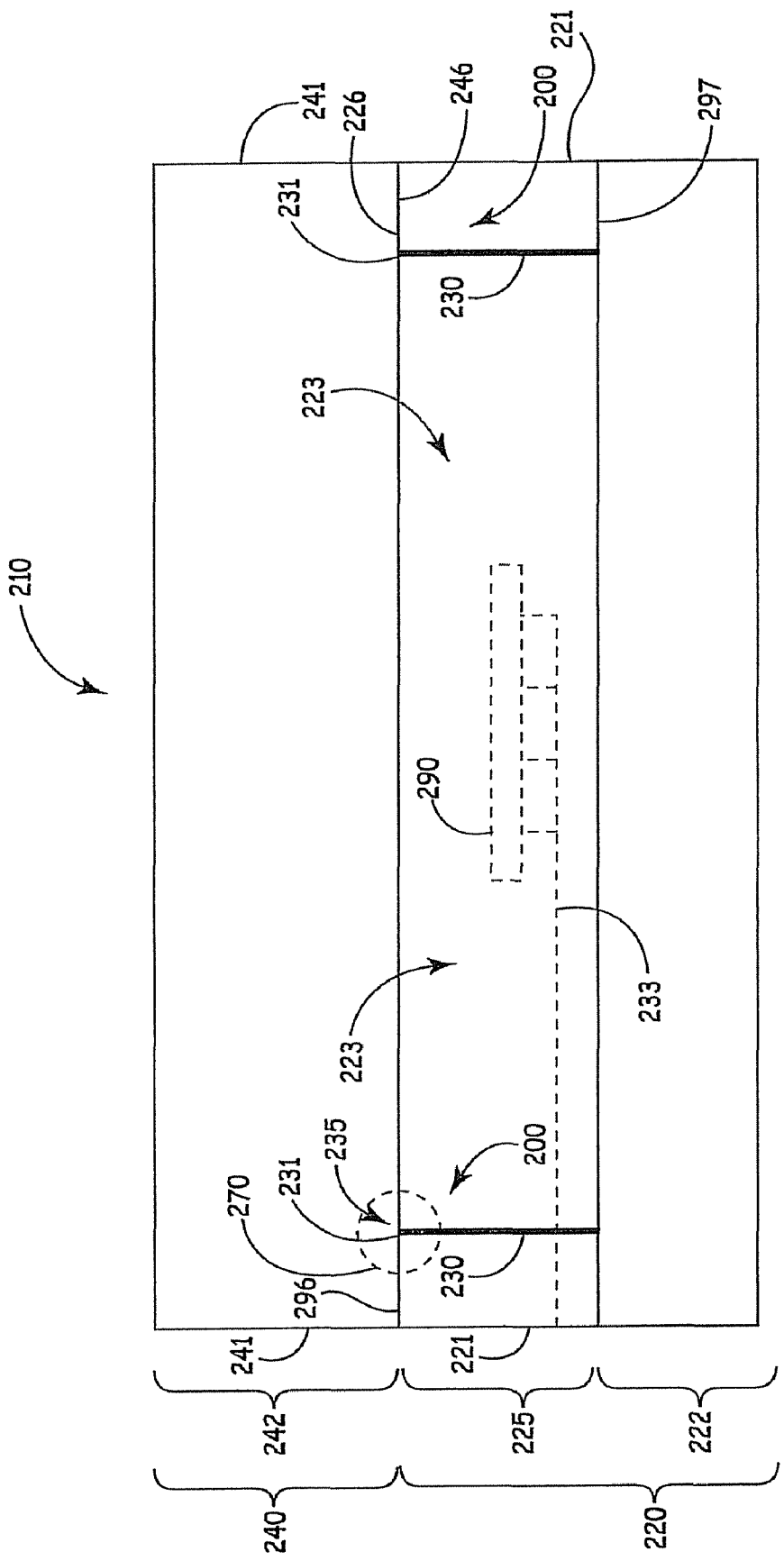
FIG. 2A is an illustrative cross-sectional side view of one exemplary embodiment of an apparatus such as generally shown in FIG. 1.

FIG. 2A is a schematic cross-sectional side view of one exemplary embodiment of an apparatus 210 that includes a first portion 220 bonded to a second portion 240. The first portion 220 includes a substrate 222 and the second portion 240 also includes a substrate 242. Substrates 222, 242 may be provided from or as a part of wafer (e.g., a doped or an undoped silicon wafer, or an insulating wafer such as glass or plastic).

The first portion 220 includes at least one side surface 221 and a substantially planar connection surface 226. The first portion 220 further includes one or more layers 225 formed on the substrate 222 terminating at a connection surface 226. A metallic structure 230 forming at least part of a moisture ingress barrier 200 and at least one circuit device 290 (e.g., one or more circuits that include electrical circuitry) may be formed within the one or more layers 225. The metallic structure 30 may be located between the at least one circuit device 290 and the at least one side surface 221. In other words, a perimeter region 223 may be defined laterally surround the circuit device 90 and extending from the circuit device 90 to the least one side surface 221, and the metallic structure 30 may be located within the perimeter regions 223.

Further, the one or more layers 225 may include any number of layers desired for providing one or more electrical interconnects (schematically shown by dashed lines 233) extending from the circuit device 290 to a location outside of the moisture ingress barrier 200 (e.g., between the moisture ingress barrier 200 and the at least one side surface 221 of the first portion 220). For example, at least in one embodiment, the one or more electrical interconnects 233 are multilayer interconnects for providing interconnection of circuit device 290 outside of the moisture ingress barrier 200. Further, in at least one embodiment, the one or more electrical interconnects 233 extend from the circuit device 290 to a location outside of the moisture ingress barrier 200 by passing through one or more insulated locations of the metallic structure 230 (e.g., locations small enough to still prevent moisture ingress). Still further, the one or more electrical interconnects 233 can be terminated at a surface of the apparatus 210 (e.g., by surface contacts as described with reference to FIGS. 1A-1B) in any number of manners (e.g., using one or more vias or additional interconnect structure).

At least a part of the moisture ingress barrier 200 may be formed from the metallic structure 230 (e.g., a plurality of conductive vias) located between at least one side surface 221 and the circuit device 290 (e.g., the perimeter region 223). Further, the metallic structure 230 may extend from the substrate 222 to the connection surface 226, e.g., terminating at the connection surface 226 in a contact 231.

The second portion 240 includes at least one side surface 241 and a substantially planar connection surface 246. The interface 296 between the connection surfaces 226, 246 of the first and second portions 220, 240 may include bonded oxide portions in locations other than where conductive elements are located (e.g., such as metallic structure 230 of the moisture ingress barrier 200). For example, such bonded oxide portions may be formed if an oxide bonding process is used to couple the first and second portions 220, 240.

Figure 2B:
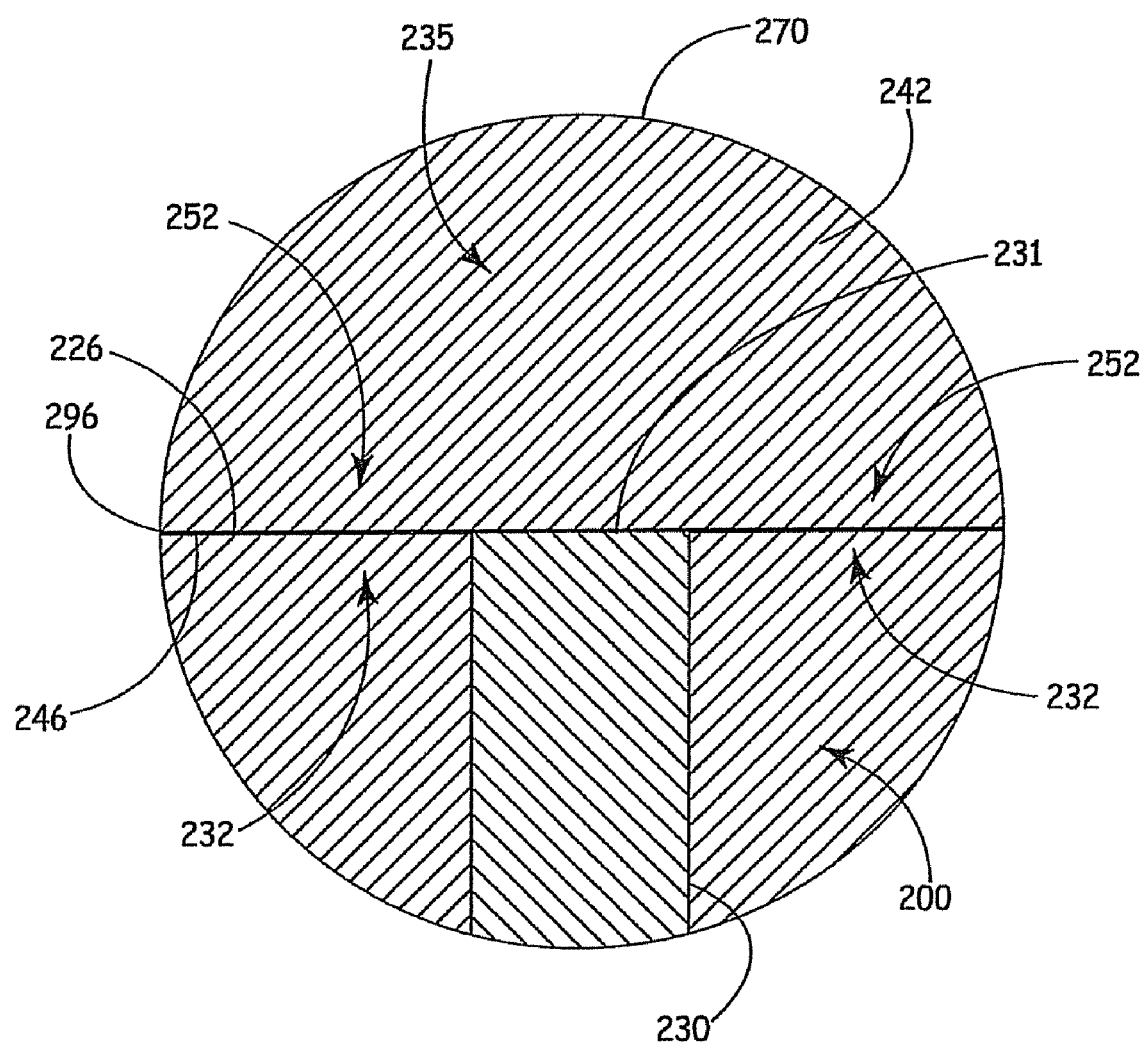
FIG. 2B is an enlarged partial cross-sectional view of the dashed circle portion of the apparatus of FIG. 2A.

Further, the bonding (e.g., oxide bonding) between the connection surface 226 of the first portion 220 and the connection surface 246 of the second portion 240 may form a hermetic interface 235 proximate the metallic structure 230 of the first portion 220 to form at least a part of the moisture ingress barrier 200. An enlarged, expanded partial cross-sectional view of the dashed circle portion 270 of FIG. 2A showing the hermetic interface 235 is depicted in FIG. 2B. As shown, one or more regions 232 of the first portion 220 adjacent the metallic structure 230 is covalently bonded to one or more regions 252 of the second portion 240 to form the hermetic interface 235 to restrict (e.g., prevent) moisture from ingressing through interface 296. For example, at least in one embodiment, the covalent bond at the hermetic interface 235 may be formed by driving off any existing water present between the connection surfaces 226, 246 and forming silicon-oxygen bonds throughout the structure such that a covalent bond is formed.

Further, due to conventional fabrication techniques (e.g., semiconductor contact layer formation, etc.), the interface 297 between the substrate 222 and the moisture ingress barrier 200 is also hermetic. As a result, the interface 296, interface 297, the metallic structure 230, and the hermetic interface 235 may form at least part of the moisture ingress barrier 200 and may restrict (e.g., prevent) moisture ingress therethrough to, e.g., protect the circuit device 290.

FIGS. 3A-3B and FIGS. 4A-4B depict exemplary embodiments of apparatus 310, 410 including a first portion 320, 420 that may be similar to the first portion 220 of the apparatus 210 described herein with reference to FIG. 2A. For example, the first portion 320 of the apparatus 310 (including a moisture ingress barrier 300, a metallic structure 330, at least one side surface 321, a substrate 322, a perimeter region 323, one or more layers 325, a substantially planar connection surface 326, a via contact 331, one or more interconnects 333, and at least one circuit device 390) and the first portion 420 of the apparatus 410 (including a moisture ingress barrier 400, a metallic structure 430, at least one side surface 421, a substrate 422, a perimeter region 423, one or more layers 425, a substantially planar connection surface 426, a via contact 431, one or more interconnects 433, and at least one circuit device 490) may be substantially similar to the first portion 220 of apparatus 210 (including the moisture ingress barrier 200, the metallic structure 230, the at least one side surface 221, the substrate 222, the perimeter region 223, the one or more layers 225, the substantially planar connection surface 226, the via contact 231, the one or more interconnects 233, and the at least one circuit device 290). As such, for simplicity, further description on the details of the first portions 320, 420 shall not be provided.

Figure 3A:
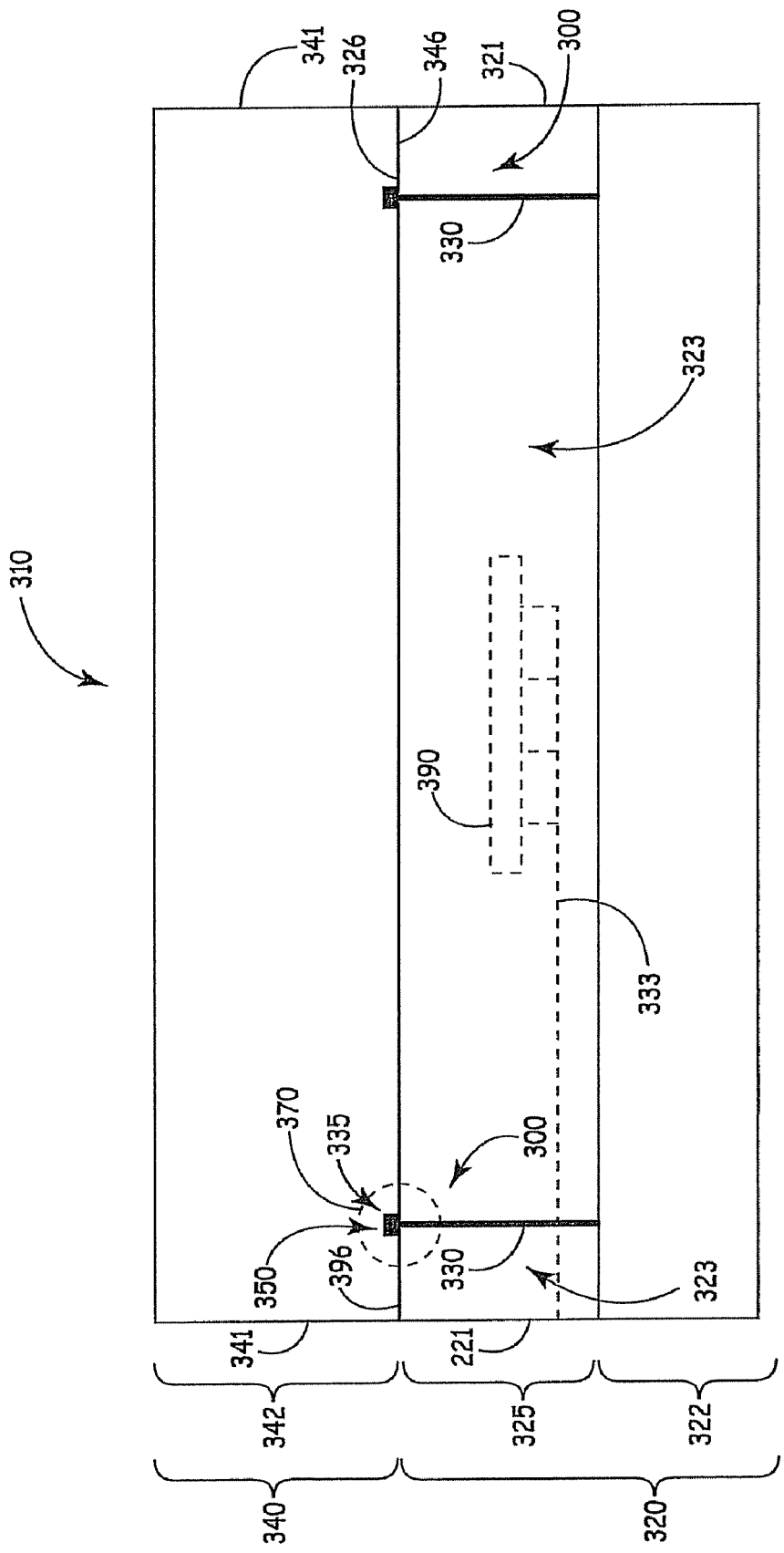
FIG. 3A is an illustrative cross-sectional side view of another exemplary embodiment of an apparatus such as generally shown in FIG. 1.

As shown in FIG. 3A, the first portion 320 is coupled to a second portion 340 to form electrical circuit apparatus 310. The second portion 340 includes a substrate 342, at least one side surface 341, and a substantially planar connection surface 346. In this embodiment, the second portion 340 further includes a metallic region 350 (e.g., a contact 351) located at the connection surface 346 as shown more clearly in FIG. 3B.

Figure 3B:
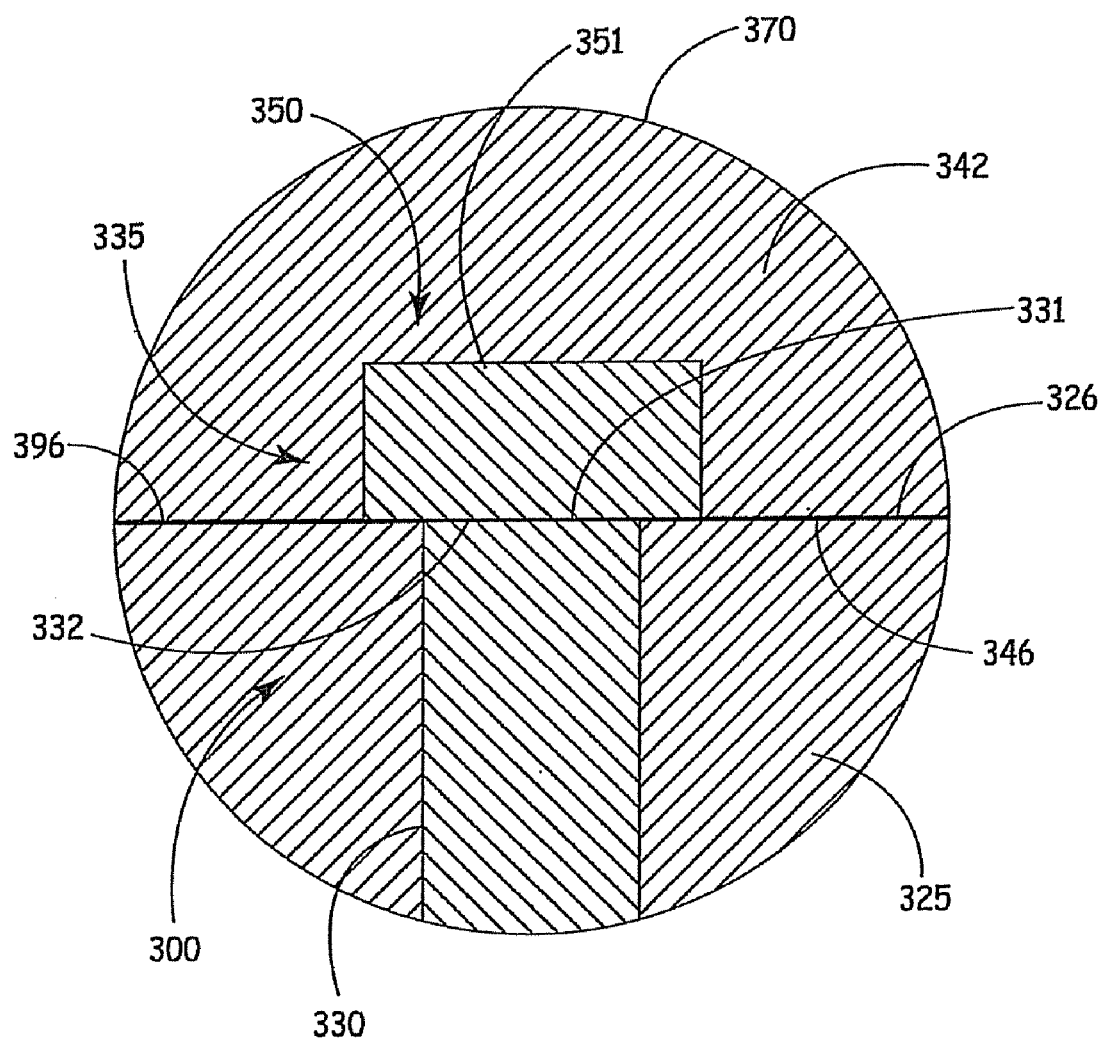
FIG. 3B is an enlarged partial cross-sectional view of the dashed circle portion of the apparatus of FIG. 3A.

The coupling (e.g., oxide bonding) between the connection surface 326 of the first portion 320 and the connection surface 346 of the second portion 240 may form a hermetic interface 335 proximate the metallic structure 330 of the first portion 320 to form at least part of the moisture ingress barrier 300. An enlarged, expanded partial cross-sectional view of the dashed circle portion 370 of FIG. 3A showing the hermetic interface 335 is depicted in FIG. 3B. As shown, the metallic structure 330 (more specifically, e.g., the contact 331) forming at least part of the moisture ingress barrier 300 is metallically bonded to the metallic region 350 (e.g., more specifically, the contact 351) of the second portion 340 to form the hermetic interface 335 to restrict (e.g., prevent) moisture from ingressing through the interface 396. Together, the hermetic interface 335, the metallic structure 330, and the metallic region 350 may form a part of or all of the moisture ingress barrier 300. For example, at least in one embodiment, the metallic bond of the hermetic interface 335 is formed by gold or gold-tin bonding. Further, as described herein with reference to FIGS. 2A-2B, one or more regions of the first portion 320 adjacent the moisture ingress barrier 300 may also be bonded (e.g., covalently bonded) to one or more regions of the second portion 340 to further form the hermetic interface 335 (e.g., using plasma-enhanced wafer bonding, etc.).

Figure 4A:
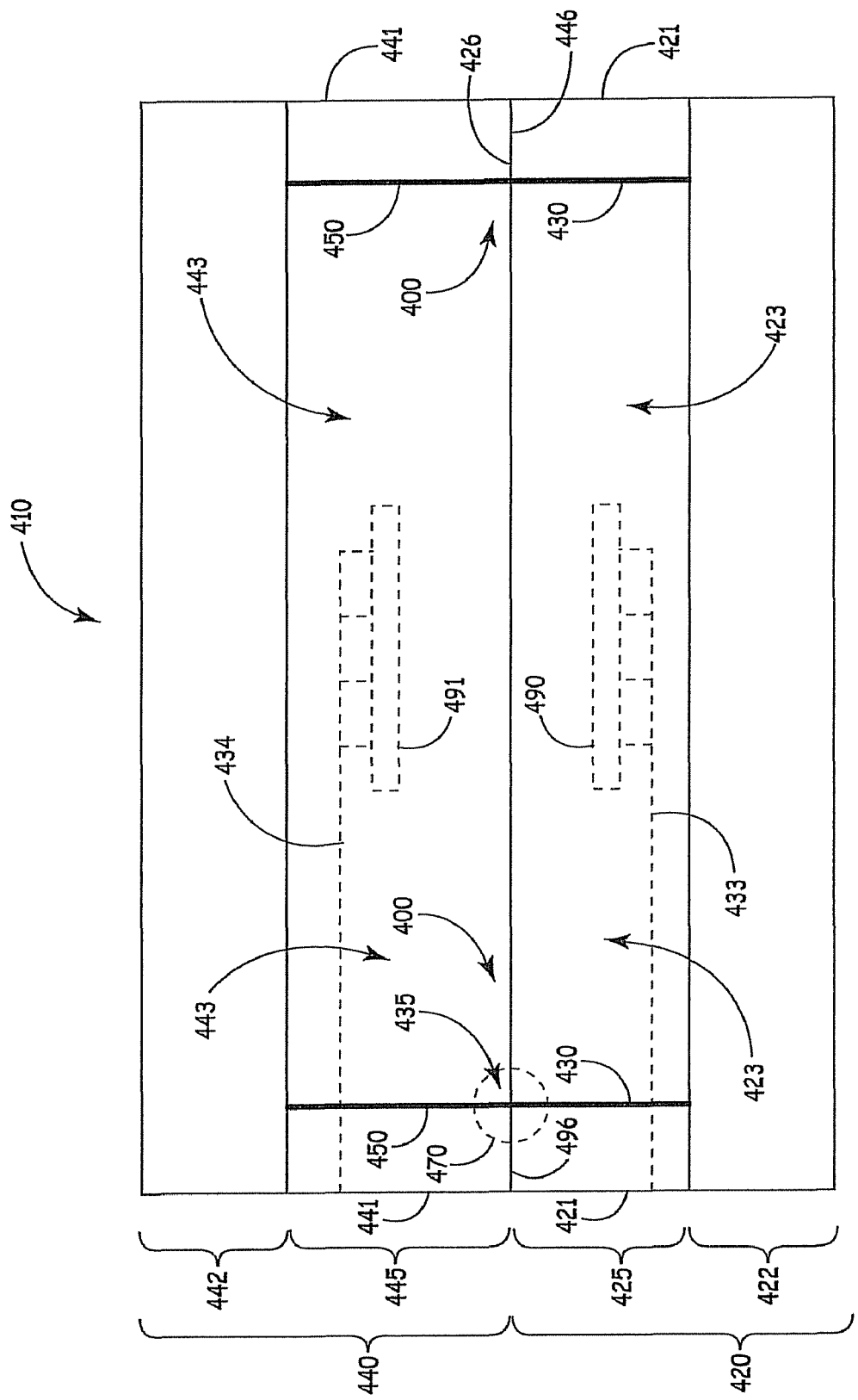
FIG. 4A is an illustrative cross-sectional side view of still another exemplary embodiment of an apparatus such as generally shown in FIG. 1.

As shown in FIG. 4A, a first portion 420 is coupled (e.g., bonded) to a second portion 440 to form electrical circuit apparatus 410. In this embodiment, the second portion 440 may be similar to the first portion 220 of the apparatus 210 described herein with reference to FIG. 2A. For example, the second portion 420 of apparatus 410 may include a metallic structure 450, at least one side surface 441, a substrate 442, one or more layers 445, a substantially planar connection surface 446, a via contact 432, one or more interconnects 434, and at least one circuit device 491 that may be substantially similar to the first portion 220 of apparatus 210 (including the metallic structure 230, the at least one side surface 221, the substrate 222, the perimeter 223, the one or more layers 225, the substantially planar connection surface 226, the via contact 231, the one or more interconnects 233, and the at least one circuit device 290). As such, for simplicity, further description on the details of second portion 440 shall not be provided.

Figure 4B:
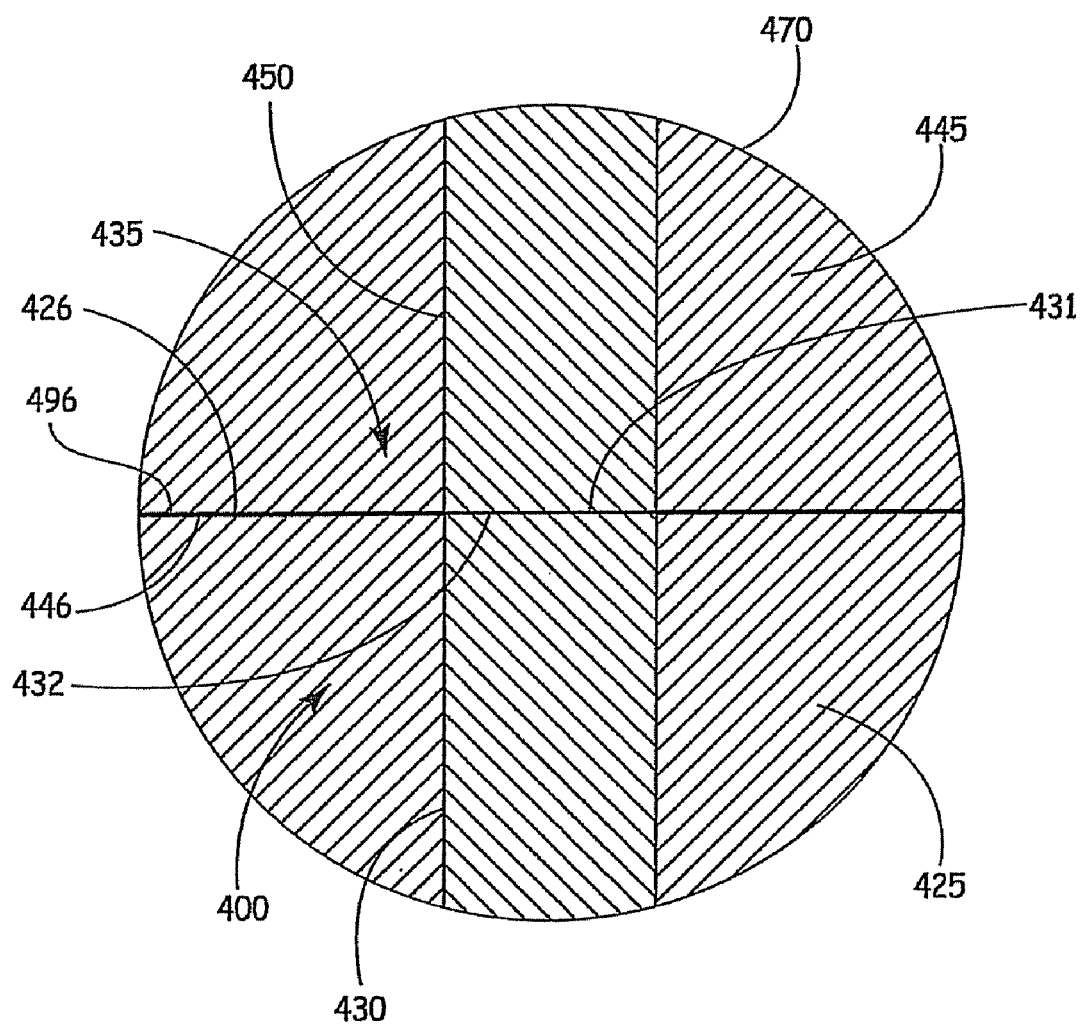
FIG. 4B is an enlarged partial cross-sectional view of the dashed circle portion of the apparatus of FIG. 4A.

The coupling (e.g., using plasma-enhanced wafer bonding) between the connection surface 426 of the first portion 420 and the connection surface 446 of the second portion 440 may form at least a hermetic interface 435 proximate the metallic structure 430 and the metallic structure 450 to form at least a part of the moisture ingress barrier 400. An enlarged, expanded partial cross-sectional view of the dashed circle portion 470 of FIG. 4A showing the hermetic interface 435 is depicted in FIG. 4B. As shown, the metallic structure 430 (e.g., more specifically, the contact 431 of the metallic structure 430) of the first portion 420 is metallically bonded to the metallic structure 450 (e.g., more specifically, the contact 432 of the metallic structure 450) of the second portion 440 to form the hermetic interface 435 to form at least a part of the moisture ingress barrier 400 to restrict (e.g., prevent) moisture from ingressing through the interface 496. Together, the metallic structures 430, 450 and the hermetic interface 435 form at least part of or all of the moisture ingress barrier 400. Further, as described herein with reference to FIGS. 2A-2B, one or more regions of the first portion 420 adjacent the metallic structure 430 may also be covalently bonded to one or more regions adjacent the metallic structure 450 of the second portion 440 to form the hermetic interface 435. Still, further the hermetic interface 435 may be formed of both metallic bonds between the metallic structures 430, 450 and covalent bonds between one or more regions of the first and second portions 420, 440 adjacent the metallic structures 430, 450.

Figure 6:
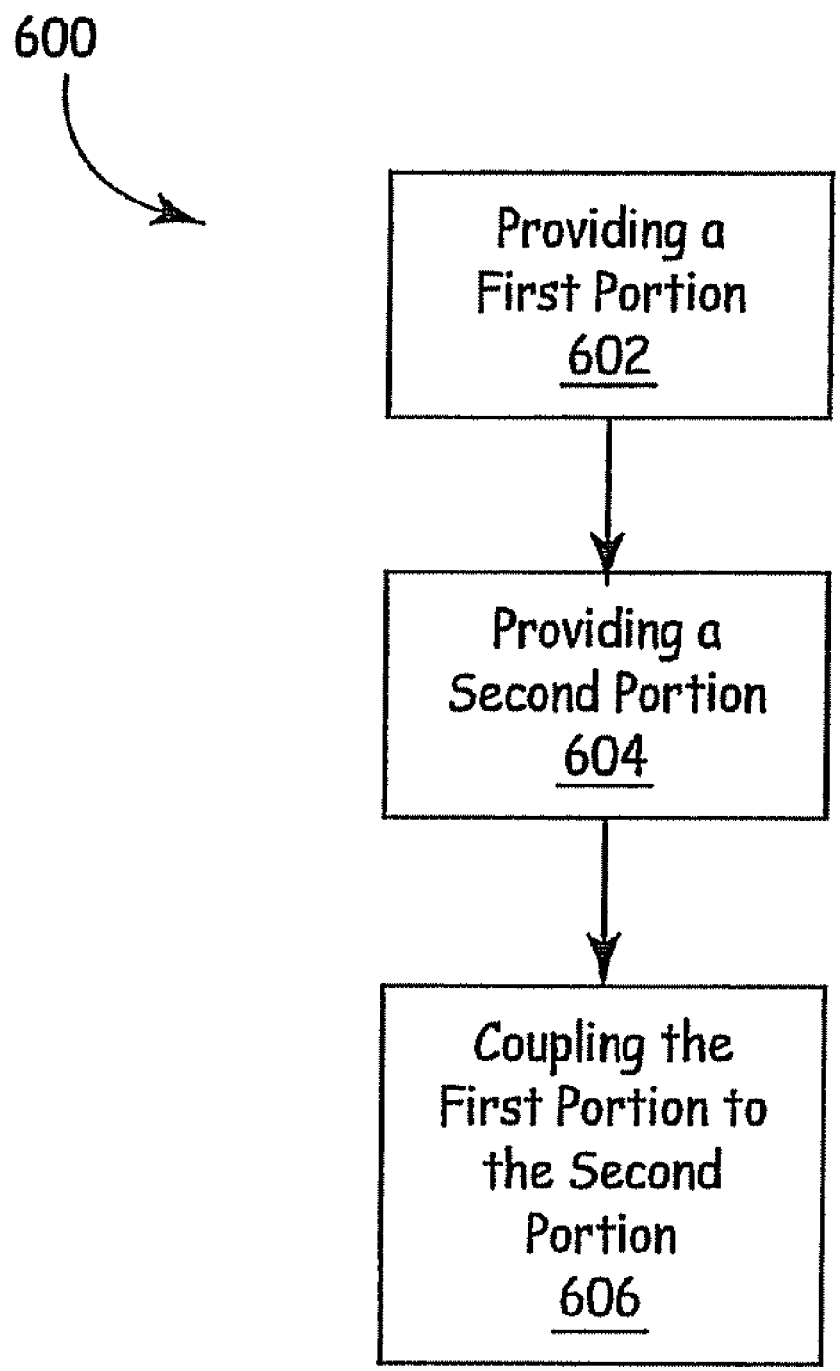
FIG. 6 is a block diagram of an exemplary method of providing an electrical circuit apparatus including a moisture ingress barrier such as generally shown in FIG. 1.

FIG. 6 is a block diagram generally illustrating a method for constructing one exemplary embodiment of an apparatus such as, for example, generally shown in FIGS. 1A-1B. The process 600 includes providing a first portion (block 602) and providing a second portion (block 604).

Providing the first portion 602 and providing the second portion 604 may include fabricating a wafer (e.g., a doped semiconductor wafer) or starting with a pre-fabbed foundry wafer. All of the structures described herein may be formed within or on such wafers. For example, the first portion 20 of apparatus 10 as shown in FIGS. 1A-1B may be processed to form the metallic structure 30 by fabricating (e.g., using any known fabrication processes including deposition, patterning, and/or etching) the one or more layers 25 on the substrate 22 terminating at a connection surface 26.

The process 600 further includes coupling (e.g., bonding) the first portion to the second portion (block 606). For example with reference to apparatus 10 of FIGS. 1A-1B, the connection surface 26 of the first portion 20 may be bonded to the connection surface 46 of the second portion 40 such that the via contacts 35 of the plurality of conductive vias 34 of the first portion 20 are in electrical contact with vias 64 of the second portion 40. In one embodiment, the connection surfaces 26, 46 may be bonded using an oxide bonding process forming an oxide interface therebetween. For example, the connection surfaces 26, 46 may each be etched, polished, or planarized (e.g., using a chemical mechanical planarization or polishing) to expose conductive locations (for example, the metallic structure 30, e.g., vias, of the moisture ingress barrier 100, the contacts 35, etc.) on the surfaces 26, 46 but leaving an oxide on the remaining portion of such surfaces 26, 46. Thereafter, the first portion 20 may be aligned with the wafer substrate 42 to, for example, match the plurality of contacts 35 of the first portion 20 with the vias 64 of the second portion 40. The oxide bond may then be performed resulting in bonded oxide portions in the interface of the connection surfaces 26, 46. Further, in an embodiment where both the first and the second portions include metallic structures (e.g., as described herein with reference to FIGS. 4A-4B), the metallic structures of each portion may be aligned before bonding so as to form at least part of the moisture ingress barrier.

The method presented in FIG. 6 is only one example of a method that may be used to implement the apparatus described herein and is not to be taken as limiting to the scope of the disclosure provided herein. Various modifications to the process steps and/or timing or order of the process steps may be made to the method while still providing the benefits of apparatus described herein.

Any features, components, and/or properties of any of the embodiments described herein may be incorporated into any other embodiment(s) described herein.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the disclosure, will be apparent upon reference to this description.

The invention claimed is:

1. A method of providing at least one electrical circuit apparatus comprising a moisture ingress barrier, wherein the method comprises:
 providing a first portion, wherein the first portion comprises a substantially planar connection surface, wherein providing the first portion comprises:
  providing a wafer substrate, and
  providing one or more layers formed on the substrate said connection surface being defined at least partially by the one or more layers, wherein the one or more layers comprise:
   at least one circuit device comprising electrical circuitry, wherein a perimeter region is defined laterally surrounding the at least one circuit device, and
   at least one metallic structure laterally surrounding the at least one circuit device, wherein the at least one metallic structure extends from the substrate to the connection surface and is located within the perimeter region; and
 providing a second portion, wherein the second portion comprises a substantially planar connection surface, wherein providing the second portion comprises providing a wafer substrate; and
 coupling the connection surface of the first portion to the connection surface of the second portion to form at least one hermetic interface proximate the at least one metallic structure of the first portion, wherein the at least one hermetic interface forms at least part of the moisture ingress barrier of the at least one electrical circuit apparatus.

2. The method of claim 1, wherein the substrate of the first portion and the substrate of the second portion comprise semiconductor substrates.

3. The method of claim 1, wherein providing the second portion further comprises providing at least one metallic region located at the connection surface of the second portion, and wherein coupling the connection surface of the first portion to the connection surface of the second portion to form the at least one hermetic interface comprises bonding the at least one metallic structure of the first portion to the at least one metallic region of the second portion to form at least a part of the at least one hermetic interface.

4. The method of claim 1, wherein coupling the connection surface of the first portion to the connection surface of the second portion to form the at least one hermetic interface comprises covalently bonding at least one region of the first portion adjacent the at least one metallic structure to at least one region of the second portion to form the at least a part of the at least one hermetic interface.

5. The method of claim 1, wherein providing the first portion further comprises providing at least one electrical interconnect formed in the one or more layers of the first portion and extending from the at least one circuit device to a location within the perimeter region, wherein the at least one electrical interconnect passes through one or more insulated locations of the at least one metallic structure.

6. The method of claim 1, wherein providing the second portion further comprises:
 providing one or more layers formed on the substrate terminating at the connection surface, wherein the one or more layers comprise:
  at least one circuit device comprising electrical circuitry, wherein a perimeter region is defined laterally surrounding each of the at least one circuit device, and
  at least one metallic structure laterally surrounding the at least one circuit device and forming at least part of the moisture ingress barrier of the at least one electrical circuit apparatus, wherein the at least one metallic structure extends from the substrate to the connection surface and is located within the perimeter region, and
 wherein coupling the connection surface of the first portion to the connection surface of the second portion comprises metallically bonding the at least one metallic structure of the first portion to the metallic structure of the second portion to form at least part of the hermetic interface.

7. A method of providing an electrical circuit apparatus in an implantable medical device, wherein the electrical circuit apparatus comprises a moisture ingress barrier, and further wherein the method comprises:
 providing a first portion comprising:
  a substrate, and
  one or more layers formed on the substrate, at least part of said one or more layers defining the connection surface, wherein the one or more layers comprise:
   at least one circuit device comprising electrical circuitry, wherein a perimeter region is defined laterally surrounding the at least one circuit device, and
   at least one metallic structure enclosing the at least one circuit device, wherein the metallic structure extends from the substrate to the substantially planar connection surface and is located within the perimeter region; and providing a second portion comprising a substantially planar connection surface, wherein providing the second portion comprises providing a substrate; and bonding the connection surface of the first portion to the connection surface of the second portion to form a hermetic interface proximate the metallic structure of the first portion, wherein the hermetic interface forms at least a part of the moisture ingress barrier.

8. The method of claim 7, wherein the substrate of the first portion and the substrate of the second portion comprise semiconductor substrates.

9. The method of claim 7, wherein the providing the second portion comprises providing a metallic region located at the connection surface, wherein the at least one metallic structure laterally surrounds the at least one circuit device, and further wherein bonding the connection surface of the first portion to the connection surface of the second portion comprises metallically bonding the metallic structure of the first portion to the metallic region of the second portion to form at least part of the hermetic interface.

10. The method of claim 7, wherein the at least one metallic structure laterally surrounds the at least one circuit device, and further wherein bonding the connection surface of the first portion to the connection surface of the second portion comprises covalently bonding a region of the first portion adjacent the metallic structure to a region of the second portion to form at least part of the hermetic interface.

11. A method of providing an electrical circuit apparatus in an implantable medical device, wherein the electrical circuit apparatus comprises a moisture ingress barrier, and further wherein the method comprises:
   providing a first portion comprising:
      a substrate, and
      one or more layers formed on the substrate terminating at a substantially planar connection surface, wherein the one or more layers comprise:
         at least one circuit device comprising electrical circuitry, wherein a perimeter region is defined laterally surrounding the at least one circuit device, and
         at least one metallic structure laterally surrounding the at least one circuit device, wherein the metallic structure extends from the substrate to the substantially planar connection surface and is located within the perimeter region; and
   providing a second portion comprising:
      a substrate, and
      one or more layers formed on the substrate terminating at a substantially planar connection surface, wherein the one or more layers comprise:
         at least one circuit device comprising electrical circuitry, wherein a perimeter region is defined laterally surrounding the at least one circuit device, and
         at least one metallic structure laterally of the at least one circuit device and forming at least part of the moisture ingress barrier, wherein the metallic structure extends from the substrate to the substantially planar connection surface and is located within the perimeter region; and
   bonding the connection surface of the first portion to the connection surface of the second portion to form a hermetic interface proximate the metallic structures of the first and second portions, wherein the hermetic interface forms at least a part of the moisture ingress barrier.

12. The method of claim 11, wherein the at least one metallic structure of the first portion laterally surrounds the at least one circuit device thereof, wherein the at least one metallic structure of the second portion laterally surrounds the at least one circuit device thereof, and further wherein bonding the connection surface of the first portion to the connection surface of the second portion comprises metallically bonding the metallic structure of the first portion to the metallic structure of the second portion to form at least part of the hermetic interface.

13. A method of providing an electrical circuit apparatus in an implantable medical device, wherein the method comprises:
   providing a first portion comprising:
      a substrate,
      one or more layers formed on the substrate, wherein the connection surface is defined at least partially by the one or more layers, and
      at least one circuit device comprising electrical circuitry, wherein a perimeter region laterally surrounds the at least one circuit device; and
   providing a second portion comprising a substantially planar connection surface, wherein providing the second portion comprises providing a substrate; and
   bonding the connection surface of the first portion to the connection surface of the second portion to provide a moisture ingress barrier, wherein the moisture ingress barrier comprises at least one metallic structure adjacent at least a portion of least one circuit device extending from the substrate of the first portion to the connection surface of the first portion and a hermetic interface proximate the metallic structure of the first portion formed upon bonding the connection surface of the first portion to the connection surface of the second portion.

14. The method of claim 13, wherein the substrate of the first portion and the substrate of the second portion comprise semiconductor substrates.

15. The method of claim 13, wherein providing the second portion comprises providing a metallic region located at the connection surface, and further wherein bonding the connection surface of the first portion to the connection surface of the second portion comprises metallically bonding the metallic structure of the first portion to the metallic region of the second portion to form at least part of the hermetic interface.

16. The method of claim 13, wherein bonding the connection surface of the first portion to the connection surface of the second portion comprises covalently bonding a region of the first portion adjacent the metallic structure to a region of the second portion to form at least part of the hermetic interface.

17. A method of providing at least one electrical circuit apparatus in an implantable medical device, the at least one electrical circuit apparatus comprising a moisture ingress barrier, wherein the method comprises:
   providing a first portion, wherein the first portion comprises a substantially planar connection surface, wherein providing the first portion comprises:
      providing a wafer substrate, and
      providing one or more layers formed on the substrate said connection surface being defined at least partially by the one or more layers, wherein the one or more layers comprise:
         at least one circuit device comprising electrical circuitry, wherein a perimeter region is defined laterally surrounding the at least one circuit device,
         at least one metallic structure laterally surrounding at least a portion of the at least one circuit device, wherein the at least one metallic structure extends from the substrate to the connection surface and is located within the perimeter region, and at least one electrical interconnect formed in the one or more layers of the first portion and extending from the at least one circuit device to a location within the perimeter region, wherein the at least one electrical interconnect passes through one or more insulated locations of the at least one metallic structure; and providing a second portion, wherein the second portion comprises a substantially planar connection surface, wherein providing the second portion comprises providing a wafer substrate, and further wherein one or more interconnect vias are formed in at least one of the first portion and the second portion and terminate at one or more surface contacts at a surface of at least one of the first and second portions, wherein the at least one electrical interconnect of the first portion connects to the one or more interconnect vias; and coupling the connection surface of the first portion to the connection surface of the second portion to form at least one hermetic interface proximate the at least one metallic structure of the first portion, wherein the at least one hermetic interface forms at least part of the moisture ingress barrier of the at least one electrical circuit apparatus.

18. The method of claim 17, wherein providing the second portion further comprises providing at least one metallic region located at the connection surface of the second portion, and wherein coupling the connection surface of the first portion to the connection surface of the second portion to form the at least one hermetic interface comprises metallically bonding the at least one metallic structure of the first portion to the at least one metallic region of the second portion to form at least a part of the at least one hermetic interface.

19. The method of claim 17, wherein coupling the connection surface of the first portion to the connection surface of the second portion to form the at least one hermetic interface comprises covalently bonding at least one region of the first portion adjacent the at least one metallic structure to at least one region of the second portion to form the at least a part of the at least one hermetic interface.

20. The method of claim 17, wherein providing the second portion further comprises:

providing one or more layers formed on the substrate terminating at the connection surface, wherein the one or more layers comprise:

at least one circuit device comprising electrical circuitry, wherein a perimeter region is defined laterally surrounding each of the at least one circuit device, and at least one metallic structure formed adjacent at least a portion of the at least one circuit device and forming at least part of the moisture ingress barrier of the at least one electrical circuit apparatus, wherein the at least one metallic structure extends from the substrate to the connection surface and is located within the perimeter region, and wherein coupling the connection surface of the first portion to the connection surface of the second portion comprises metallically bonding the at least one metallic structure of the first portion to the metallic structure of the second portion to form at least part of the hermetic interface.

* * * * *